United States Patent
Ichikawa

(10) Patent No.: US 7,196,378 B2
(45) Date of Patent: Mar. 27, 2007

(54) ELECTROSTATIC-PROTECTION DUMMY TRANSISTOR STRUCTURE

(75) Inventor: Kenji Ichikawa, Tokyo (JP)

(73) Assignee: Oki Electric Indusrty Co., Ltd., Tokyo (JP)

( * ) Notice: Subject to any disclaimer, the term of this patent is extended or adjusted under 35 U.S.C. 154(b) by 0 days.

(21) Appl. No.: 10/810,668

(22) Filed: Mar. 29, 2004

(65) Prior Publication Data

US 2004/0195625 A1     Oct. 7, 2004

(30) Foreign Application Priority Data

Apr. 1, 2003     (JP) .............................. 2003-098423

(51) Int. Cl.
*H01L 23/62* (2006.01)
(52) U.S. Cl. ...................... 257/357; 257/173
(58) Field of Classification Search ................ 257/328, 257/357, 355–356, 369; 438/21, 268; 361/56, 361/111

See application file for complete search history.

(56) References Cited

U.S. PATENT DOCUMENTS

| | | | | |
|---|---|---|---|---|
| 4,303,958 A | * | 12/1981 | Allgood ...................... 361/100 |
| 5,514,893 A | * | 5/1996 | Miyanaga et al. ........... 257/360 |
| 5,610,790 A | * | 3/1997 | Staab et al. .................... 361/56 |
| 6,034,397 A | * | 3/2000 | Voldman ...................... 257/335 |
| 6,239,958 B1 | * | 5/2001 | Kato et al. ..................... 361/56 |
| 6,479,883 B1 | * | 11/2002 | Chen et al. ................... 257/546 |
| 6,608,744 B1 | * | 8/2003 | Kato ........................... 361/111 |
| 6,646,840 B1 | * | 11/2003 | Sugerman et al. ............ 361/56 |
| 6,653,709 B2 | * | 11/2003 | Wu et al. ..................... 257/499 |
| 6,744,107 B1 | * | 6/2004 | Ker et al. .................... 257/401 |
| 6,784,496 B1 | * | 8/2004 | Brodsky et al. ............ 257/355 |
| 6,809,915 B2 | * | 10/2004 | Lai et al. ..................... 361/111 |
| 6,885,529 B2 | * | 4/2005 | Ker et al. ..................... 361/56 |

FOREIGN PATENT DOCUMENTS

JP     2001-358297     12/2001

* cited by examiner

*Primary Examiner*—Thao X. Le
(74) *Attorney, Agent, or Firm*—Rabin & Berdo, PC

(57) ABSTRACT

A semiconductor apparatus where output and protection transistors are different in transistor structure, and where, even when breakdown in the output transistor occurs earlier than in the protection transistor, an ESD surge current does not concentrate in the output transistor inferior in ESD resistance. Formed in its output circuit, where the drain and source of a first-conductivity-type, e.g. NMOS, output transistor 11 are connected respectively to an output electrode and to ground, is an NMOS protection transistor 10 of which the drain and source are connected respectively to the drain and source of the NMOS output transistor 11 and of which the gate is directly connected to a second-conductivity-type layer, a P-well 22, under the gate electrode of the NMOS output transistor 11. By this means, an electrostatic surge does not concentrate in the NMOS output transistor 11.

30 Claims, 8 Drawing Sheets

ELECTROSTATIC-PROTECTION DUMMY TRANSISTOR STRUCTURE

BACKGROUND OF THE INVENTION

1. Field of the Invention

The present invention relates to an anti-electrostatic destruction protection circuit provided in an output circuit of a semiconductor apparatus.

2. Description of the Related Art

A protection device is formed in input and output circuits of a semiconductor apparatus to make unnecessary electrostatic surges bypass the element section of the circuit in order to prevent electrostatic destruction. A protection circuit using a diode is disclosed in Japanese Patent Laid-Open Publication No. 2001-358297. FIG. 6 illustrates a typical output circuit for LSIs. As seen from an output electrode (PAD) 64, an N-channel-MOS-type (NMOS) output transistor 61 and an NMOS dummy transistor 60 are arranged in parallel with respect to GND, and a P-channel-MOS-type (PMOS) output transistor 63 and a PMOS dummy transistor 62 are arranged in parallel with respect to a power supply (VDD).

The dummy transistor is a protection transistor inserted for compensating for the shortage of the gate width when ESD (Electro-Static Discharge) protection capability of the output transistor is low, and the gate is fixed to be in an off state (at a GND level for NMOS transistors and at a VDD level for PMOS transistors).

The device structure of the dummy transistor is often the same as that of the output transistor for the sake of easiness in forming in production. However, recently as salicide process has become mainstream, cases have been emerging where the output and dummy transistors have been formed to have different device structures. The reason for this is to increase ESD protection capability of the output circuit by making dummy transistors have a structure with high ESD protection capability.

A typical ESD protection NMOS transistor for the salicide process is shown in FIG. 7, where (a) is a schematic plan view and (b) is a schematic cross-sectional view taken along line A—A. An NMOS transistor having source N+ diffusion layers 73, a drain N+ diffusion layer 74, and gate electrodes 71 is formed in a P-well 72 on a substrate 70. A salicide block 75 covers the drain side except a contact area (diffusion layer connection holes 77) and areas adjacent to the gates so that the diffusion layers between the contacts and the gates are prevented from becoming silicide, thereby having resistance components. Silicides 76 are formed on the areas not covered by the salicide block 75.

By this means, when an ESD surge is applied to the drain, voltage drops due to the resistance components of the non-silicide areas reduce stress on the PN-junction, thereby improving junction destruction resistance. Meanwhile, a transistor having a device structure superior in ESD resistance to the transistor of FIG. 7 has been made apparent by recent studies.

A transistor equivalent to that is shown in FIG. 8, where (a) is a schematic plan view and (b) is a schematic cross-sectional view taken along line B—B. An NMOS transistor having source N+ diffusion layers 83, a drain N+ diffusion layer 84, and gate electrodes 81 is formed in a P-well 82 on a substrate 80. A salicide block 85 covers the entire transistor area except the areas of diffusion layer connection holes 87 in the drain and source so that silicide is not formed. Thus, the transistor has a structure where silicides 86 are formed only on the areas of the diffusion layer connection holes 87 and where silicide is not formed on the neighborhood of the gate electrodes and on the gate electrodes. It is considered that the improvement of ESD resistance over the transistor structure of FIG. 7 is mainly due to the diffusion layers adjacent to the gate electrodes being non-silicide.

If a silicide layer exists adjacent to the gate electrode, a surge current flows through the low-resistance silicide layer, and thus an electric field applied across the thin silicide layer when the PN-junction breaks down tends to cause junction destruction. Because the input circuit does not have an output transistor like the output circuit, the use of such a protection device with excellent ESD resistance is very effective. Although the drain-source salicide block structure improves ESD resistance, a silicide layer is not formed on the gate electrode, thereby making the gate's resistance higher. Thus, output transistors having that structure are larger in gate delay and not appropriate for high speed operation.

Hence, in output circuits, if the transistor structure of FIG. 8, which is high in ESD resistance and with which the transistor area can be made smaller, is used for dummy transistors, and the conventional transistor structure of FIG. 7 is used for output transistors, then high speed operation, high ESD resistance, and the reduction of the circuit area can be realized at the same time.

The following problem may occur. When a positive surge is applied through the output pad, because the breakdown voltage of the output transistor is lower than that of the dummy transistor, the output transistor responds earlier to the ESD surge, and thereby a surge current concentrates therein, not flowing through the protection transistor with high ESD resistance, thus lowering the ESD resistance of the output port.

As described above, the circuit characteristic and the ESD resistance are in a trade-off relationship. It is expected that cases where the transistor structures of the output and protection transistors are different will continue to increase.

SUMMARY OF THE INVENTION

The present invention was made in view of the above problem with the anti-electrostatic destruction protection circuit provided in conventional output circuits of a semiconductor apparatus. An object of the invention is to provide a new improved semiconductor apparatus which has an ESD surge current flow through the dummy transistor without the entire ESD surge current concentrating in the output transistor inferior in ESD resistance, even when the breakdown of the output transistor occurs prior to that of the protection transistor because the transistor structures of the output and protection transistors are different, and of which the electrostatic destruction resistance is thus improved.

In order to solve the above problem, according to the present invention, there is provided a semiconductor apparatus which protects a first-conductivity-type MOS output transistor against a surge entering through an output electrode connected to a drain of the first-conductivity-type MOS output transistor, the apparatus comprising:

a first-conductivity-type MOS protection transistor having a drain connected to the drain of the first-conductivity-type MOS output transistor, a source connected to a source of the first-conductivity-type MOS output transistor, and a gate connected to a second-conductivity-type layer under a gate of the first-conductivity-type MOS output transistor.

In the semiconductor apparatus, the first-conductivity-type MOS protection transistor may be higher in electrostatic destruction withstand voltage than the first-conductivity-type MOS output transistor.

Further, in the semiconductor apparatus, the drain of the first-conductivity-type MOS protection transistor may be formed closer to the output electrode than the drain of the first-conductivity-type MOS output transistor.

Moreover, in the semiconductor apparatus, the gate of the first-conductivity-type MOS protection transistor may be connected by an electrode wiring to the second-conductivity-type layer under the gate of the first-conductivity-type MOS output transistor.

Furthermore, in the semiconductor apparatus, the first-conductivity-type MOS output transistor and the first-conductivity-type MOS protection transistor may be of an SOI structure. In this case, the semiconductor apparatus may further comprise a second-conductivity-type area connected to the second-conductivity-type layer under the gate of the first-conductivity-type MOS output transistor, and wherein the gate of the first-conductivity-type MOS protection transistor is connected via the second-conductivity-type area to the second-conductivity-type layer under the gate of the first-conductivity-type MOS output transistor.

Further, according to the present invention, there is provided a semiconductor apparatus which protects a first-conductivity-type MOS output transistor and a second-conductivity-type MOS output transistor against a surge entering through an output electrode connected to each of drains of the first-conductivity-type MOS output transistor whose source is connected to ground and the second-conductivity-type MOS output transistor whose source is connected to a power supply, the apparatus comprising:

a first-conductivity-type MOS protection transistor having a drain connected to the drain of the first-conductivity-type MOS output transistor, a source connected to a source of the first-conductivity-type MOS output transistor, and a gate connected to a second-conductivity-type layer under a gate of the first-conductivity-type MOS output transistor; and a second-conductivity-type MOS protection transistor having a drain connected to the drain of the second-conductivity-type MOS output transistor, a source connected to a source of the second-conductivity-type MOS output transistor, and a gate connected to a first-conductivity-type layer under a gate of the second-conductivity-type MOS output transistor.

In the semiconductor apparatus, the first-conductivity-type MOS protection transistor and the second-conductivity-type MOS protection transistor may be higher in electrostatic destruction withstand voltage than the first-conductivity-type MOS output transistor and the second-conductivity-type MOS output transistor.

Further, in the semiconductor apparatus, the drains of the first-conductivity-type MOS protection transistor and the second-conductivity-type MOS protection transistor may be formed closer to the output electrode than the drains of the first-conductivity-type MOS output transistor and the second-conductivity-type MOS output transistor.

Moreover, in the semiconductor apparatus, the gates of the first-conductivity-type MOS protection transistor and the second-conductivity-type MOS protection transistor may be connected by electrode wirings respectively to the second-conductivity-type layer under the gate of the first-conductivity-type MOS output transistor and to the first-conductivity-type layer under the gate of the second-conductivity-type MOS output transistor.

Furthermore, in the semiconductor apparatus, the first-conductivity-type MOS output transistor, the first-conductivity-type MOS protection transistor, the second-conductivity-type MOS output transistor, and the second-conductivity-type MOS protection transistor may be of an SOI structure.

In this case, the semiconductor apparatus may further comprise a second-conductivity-type area connected to the second-conductivity-type layer under the gate of the first-conductivity-type MOS output transistor; and a first-conductivity-type area connected to the first-conductivity-type layer under the gate of the second-conductivity-type MOS output transistor, wherein the gate of the first-conductivity-type MOS protection transistor is connected via the second-conductivity-type area to the second-conductivity-type layer under the gate of the first-conductivity-type MOS output transistor, and wherein the gate of the second-conductivity-type MOS protection transistor is connected via the first-conductivity-type area to the first-conductivity-type layer under the gate of the second-conductivity-type MOS output transistor.

The above and other objects and features of the present invention will become apparent from the following detailed description and the appended claims with reference to the accompanying drawings.

DETAILED DESCRIPTION OF THE PREFERRED EMBODIMENT

Figure 1A:
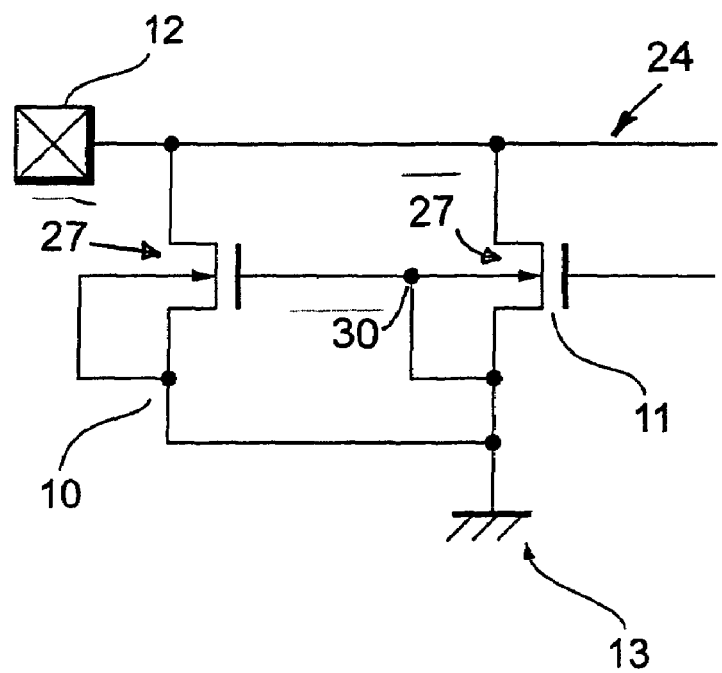
FIG. 1(a) is a schematic circuit diagram of an output section according to the present embodiment.

A preferred embodiment of a semiconductor apparatus according to the present invention will be described in detail below with reference to the accompanying drawings. In the present description and drawings, constituents having substantially the same functions are indicated by the same reference numerals, with omitting an overlapping description.

FIG. 1 illustrates a first embodiment. FIG. 1(a) is a schematic circuit diagram of an output section, and (b) is an explanation view representing the cross-section structure of the element section thereof.

Figure 2:
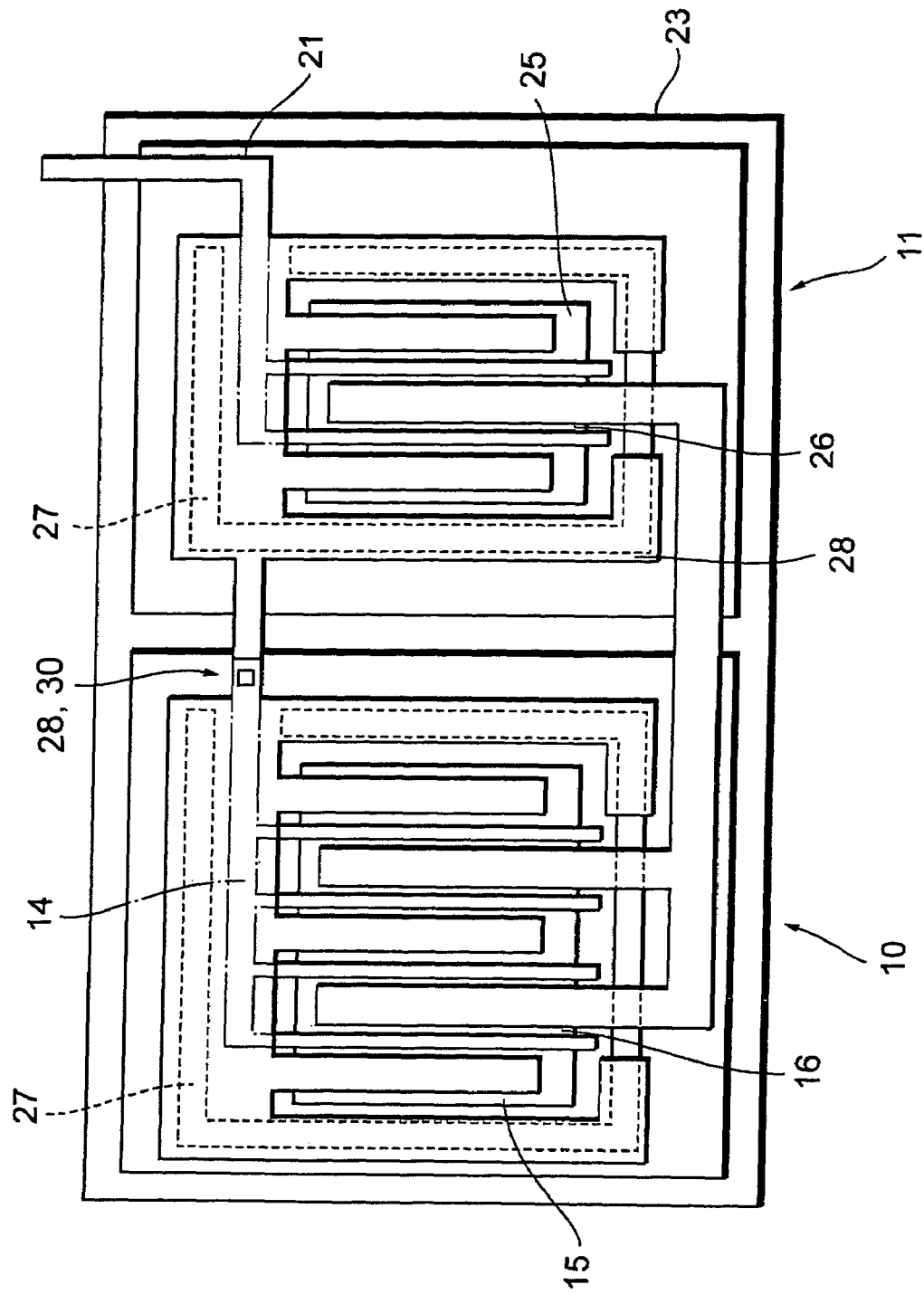
FIG. 2 is an actual layout view of an output circuit section including a dummy transistor according to the present embodiment.

Furthermore, FIG. 2 is a schematic layout view of the output circuit section including a dummy (protection) transistor of the present embodiment.

First, the structure of the present embodiment will be explained. As shown in FIG. 1(a), the output circuit comprises an NMOS dummy transistor 10 having high ESD resistance as a first-conductivity-type MOS protection transistor and an NMOS output transistor 11 having low ESD resistance as a first-conductivity-type MOS output transistor; the drain of the NMOS dummy transistor 10 is connected to the drain of the NMOS output transistor 11 and to an output electrode (PAD) 12; the source of the NMOS dummy transistor 10 is connected to the source of the NMOS output transistor 11 and to GND 13, a ground level; and the gate of the NMOS dummy transistor 10 is connected to a second-conductivity-type layer, a P-well, under the gate of the NMOS output transistor 11.

Figure 1B:
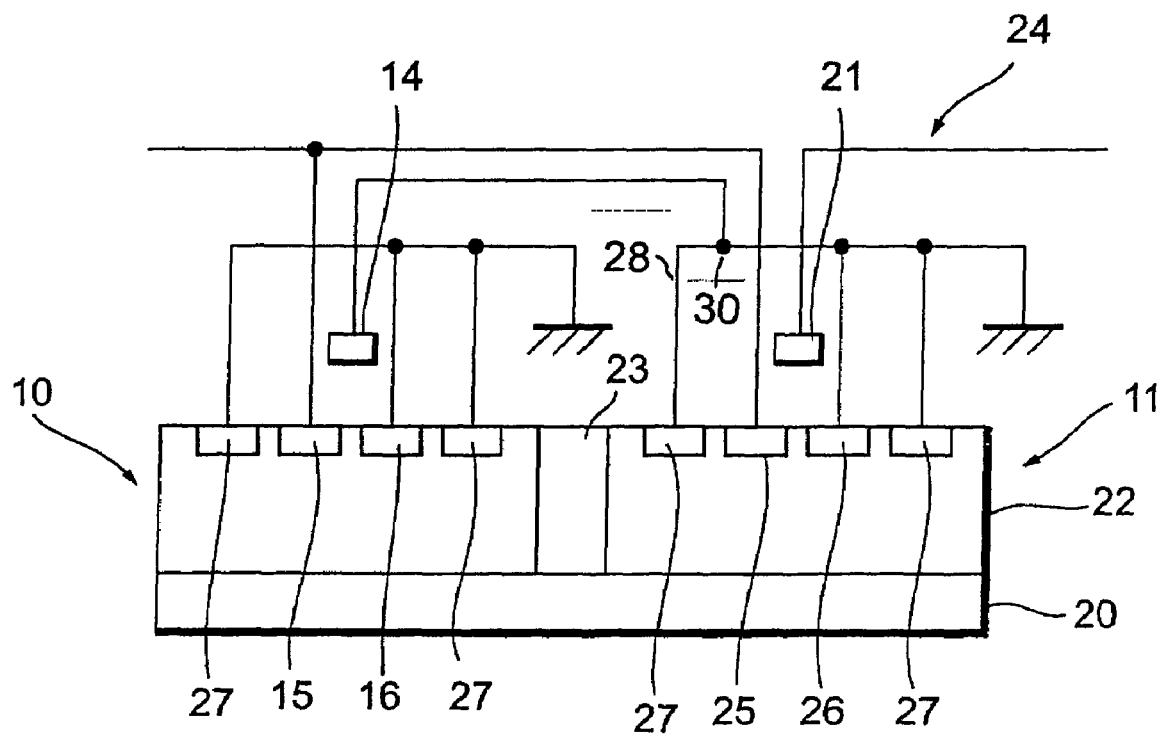
FIG. 1(b) is an explanation view representing the cross-section structure of an element section according to the present embodiment.

As shown in FIG. 1(b), in the cross-section structure, a P-well 22 is formed on a P-type substrate 20; a drain N+ diffusion layer 15 and a source N+ diffusion layer 16 are formed in the area of the NMOS dummy transistor 10; and a drain N+ diffusion layer 25, a source N+ diffusion layer 26, and a P+ contact layer 27 to be connected to GND are formed in the area of the NMOS output transistor 11. The area of the NMOS dummy transistor 10 and the area of the NMOS output transistor 11 are separated by an N-well 23. A gate electrode 14 of the NMOS dummy transistor 10 is connected to the P-well 22 via the P+ contact layer 27 of the NMOS output transistor 11, and a gate electrode 21 of the NMOS output transistor 11 is connected to an output signal line 24.

Here, the gate electrode and the P-well are preferably directly connected by a wiring and the like and not via another well. This is because, if connected via a well, the high well resistance would be inserted. Since an ESD surge is a disturbance noise having a duration of several tens nanoseconds, the delay until the gate potential of the protection transistor rises needs to be as small as possible, and accordingly they are directly connected by a low-resistance metal wiring.

The layout view of FIG. 2 shows a wiring example where the gate electrode 14 of the NMOS dummy transistor 10 is connected to the P+ contact layer 27 (P-well 22). A connection hole is provided at a joint 30 and the gate electrode 14 is connected to a metal wiring 28 connected to the P-well 22. Because the gate electrode 14 and the P-well 22 are connected by the electrode wiring, the layout area does not increase compared with the conventional structure.

The layout view of FIG. 2 also shows that, in both the NMOS output transistor 11 and in the NMOS dummy transistor 10, the P+ contact layer 27 (which is an area of P-well 22, as shown in FIG. 1(b)) substantially surrounds the structures including the gates, sources, and drains of the transistors 10 and 11, forming an almost-closed loop in each transistor. This is also indicated by cross-sectional view FIG. 1(b) of the same embodiment, which shows four areas 27 that lie on either side of the gates 14 and 21, the drains 15 and 25, and the sources 16 and 26.

Figure 3:
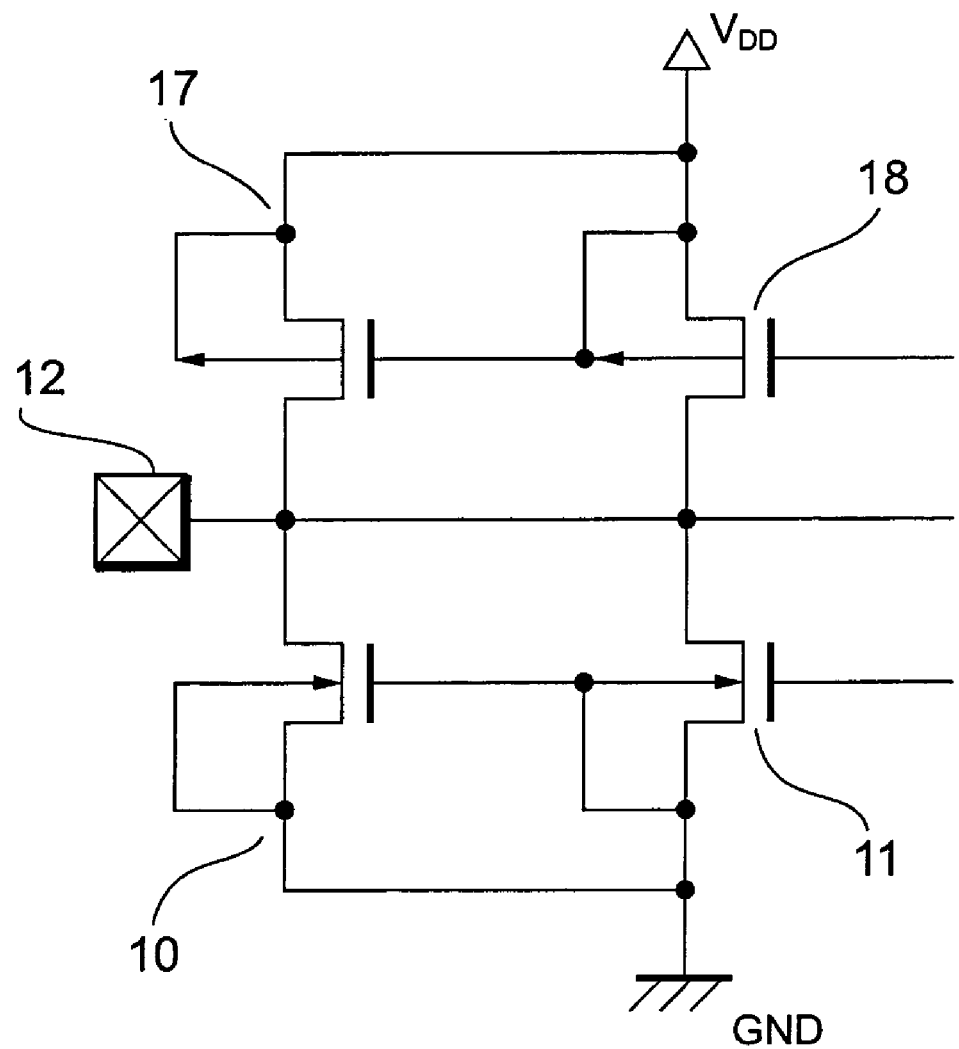
FIG. 3 is a schematic circuit diagram in the case where the output circuit is of a CMOS output configuration.

Here, the output circuit of FIG. 1 has an NMOS output transistor alone for the sake of making the structure easy to understand, but of course, can be applied to the CMOS output structure using an NMOS output transistor and a PMOS output transistor as mentioned with the prior art. In this case, as shown in FIG. 3, on a PMOS output transistor 18 side, the gate of a PMOS protection transistor 17 and a N-well of the PMOS output transistor are connected.

In a situation where a positive ESD surge enters into the output circuit of the present embodiment through the output PAD, even when breakdown occurs between the drain of the NMOS output transistor and the P-well prior to breakdown of the NMOS dummy transistor, holes injected into the P-well raises the potential of the P-well, and before turning on a parasitic NPN bipolar transistor constituted by the NMOS output transistor, the raised potential of the P-well is supplied to the gate of the NMOS dummy transistor. Thus, the NMOS dummy transistor is turned on to allow part of the ESD surge current to flow as a transistor current to GND.

Next, the operations of the transistors in the case where a surge current is entered through the output pad will be described according to the sequence in which the applied surge travels from the pad to GND. First, the behavior of an NMOS transistor to a positive surge will be described. When a positive surge is applied to the drain of an NMOS transistor, the PN-junction between the drain (N+) and the P-well (P−) is reverse-biased, and when the reverse-bias exceeds a certain voltage, breakdown occurs to inject holes into the P-well. When the holes reach the P+ diffusion layer fixed at a GND potential, a well (substrate) current flows, thereby raising the potential of the P-well.

When the P-well potential exceeds flat band voltage of the PN-junction, the junction between the P-well and the source (N+) becomes forward-biased to cause a current to flow to the source. Thus, an NPN parasitic bipolar transistor formed by the drain (N+), the P-well (P−), and the source (N+) is turned on, so that a bipolar current flows from the drain (collector) to the source (emitter). That is, the electrostatic surge is allowed to flow as a bipolar current to GND.

Here, in a situation where a positive surge enters through the output pad, even when breakdown occurs earlier on the output transistor side low in ESD resistance to raise the potential of the P-well (substrate), the raised potential is transmitted to the gate of the dummy (protection) transistor directly connected to the P-well to turn on the protection transistor. During this time, breakdown supposedly occurs on the protection transistor side as well, and thus in actual operation, the bipolar current of the output transistor, the ON-current and the bipolar current on the protection transistor side flow in parallel. In this manner, current due to the electrostatic surge does not concentrate only in the output transistor side, thus improving destruction withstand voltage.

Next, when a negative surge is applied to the output pad, the PN-junction in the NMOS transistor is forward-biased by the negative surge, breakdown due to a local electric field does not occur as with the positive surge (the depletion layer does not expand). Thus, ESD resistance is usually stronger than to a positive surge. Even when the output and protection transistors are different in shape, there is hardly any difference in flat band voltage, and thus, there is no difference in rise (response) between the output and protection transistors, so that current divides equally to flow to GND.

As described above, in the present embodiment, by connecting the gate of the dummy transistor, which is high in ESD resistance and later in breakdown, to the Body region of the output transistor, which is low in ESD resistance and earlier in breakdown, when breakdown due to an ESD surge occurs earlier in the output transistor, the gate potential of the dummy transistor rises in conjunction with the rise of the Body potential. Thus, with the ON-current of the dummy transistor flowing, the surge current does not concentrate in the output transistor, thereby protecting the output transistor.

Figure 4A:
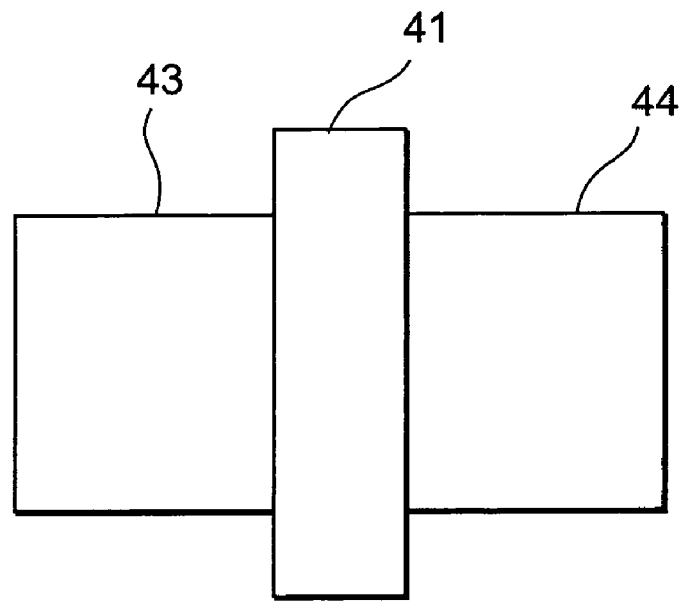
FIG. 4(a) is a schematic plan view of an SOI-structured device according to the present embodiment.
Figure 4B:
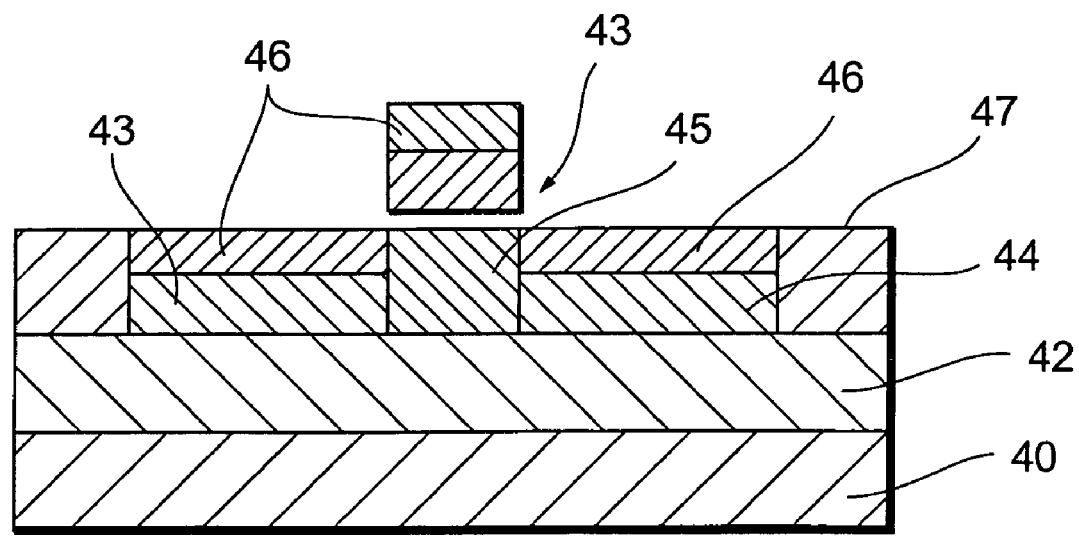
FIG. 4(b) is a schematic cross-sectional view of the SOI-structured device.

Moreover, the present embodiment can be applied not only to bulk-structured devices as described above but also to the output circuits of SOI (Silicon On Insulator) structured devices. FIG. 4 shows a typical SOI-structured device, where (a) is a schematic plan view and (b) is a schematic cross-sectional view.

In the SOI structure, a layer of a buried oxide film 42 is formed on a substrate 40; formed thereon are a drain portion N+ diffusion layer 43, a source portion N+ diffusion layer 44, a gate portion P-diffusion layer 45, and a field oxide film 47; and silicide is formed over the tops of the N+ diffusion layer 43, the N+ diffusion layer 44, and a gate electrode 41. Because the device is formed by the thin N+ diffusion layers, there is no well. Hence, by connecting the gate electrode 41 of the protection transistor to the area of the P− diffusion layer 45 under the gate electrode, the same effect as with the bulk-structure can be obtained.

Figure 5:
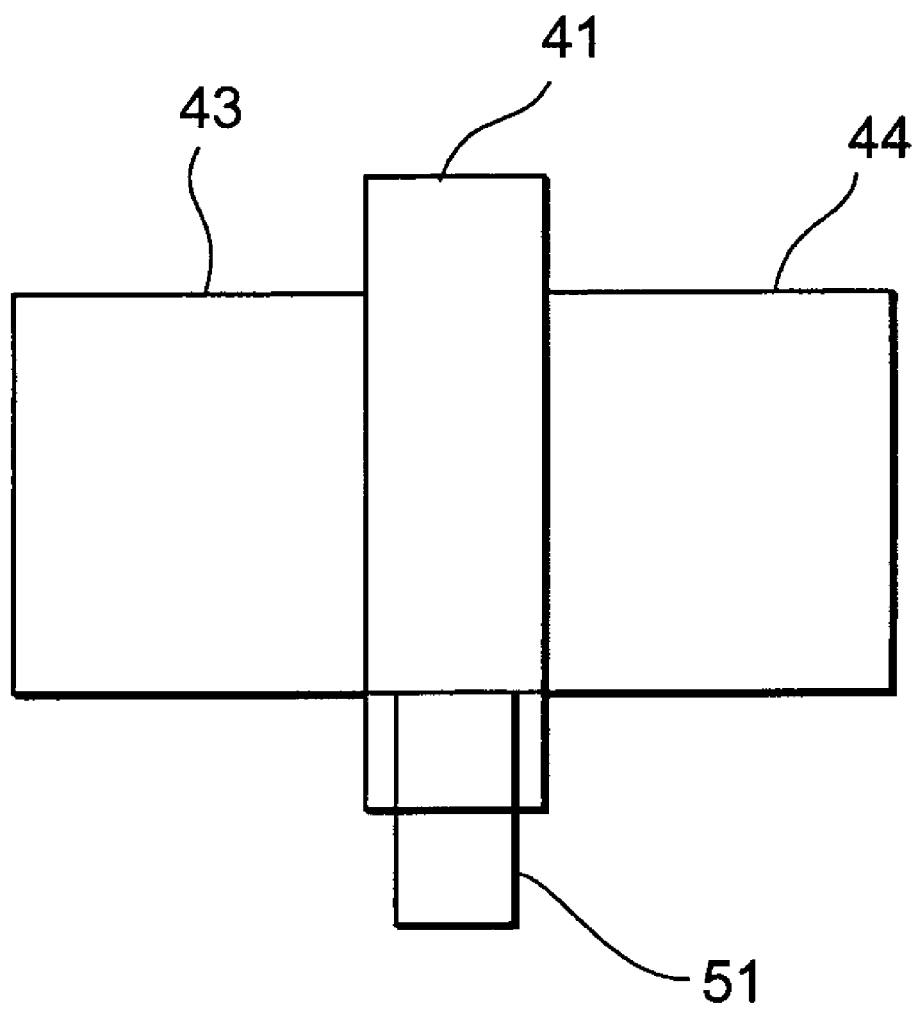
FIG. 5 is a schematic pattern view for showing a method of directly connecting a gate electrode to a P+ area in the case of the SOI-structured device according to the present embodiment.
Figure 6:
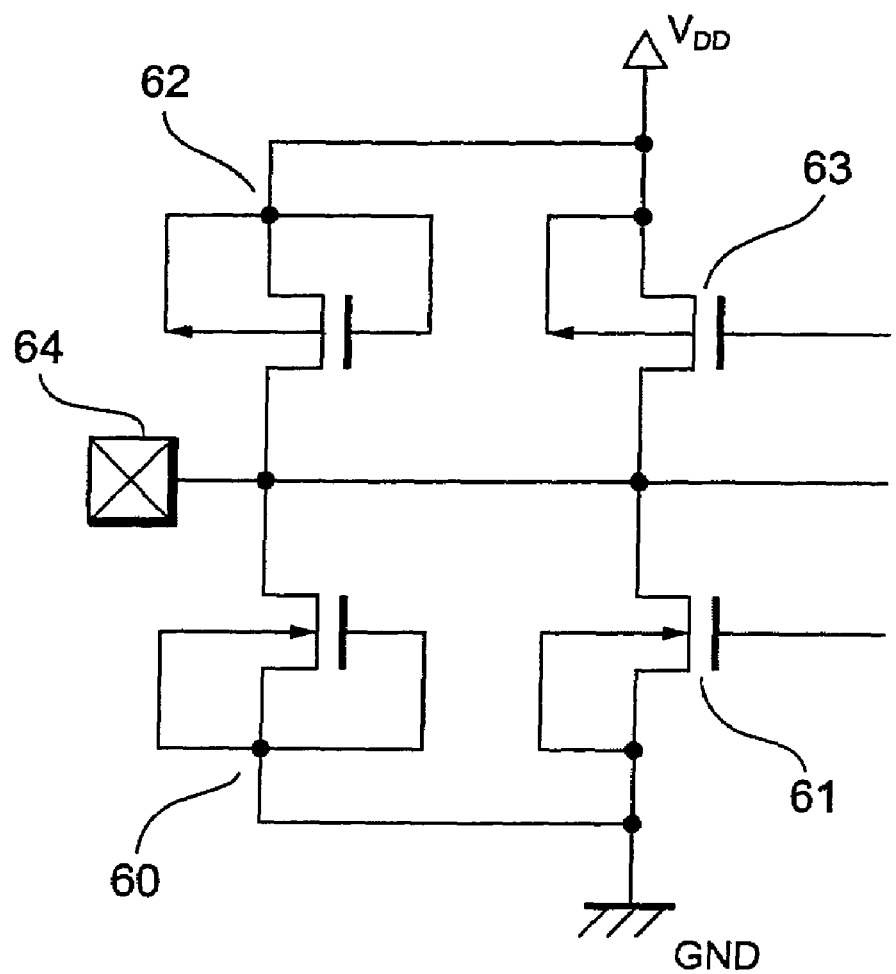
FIG. 6 shows a typical LSI output circuit including a protection transistor according to the prior art.
Figure 7A:
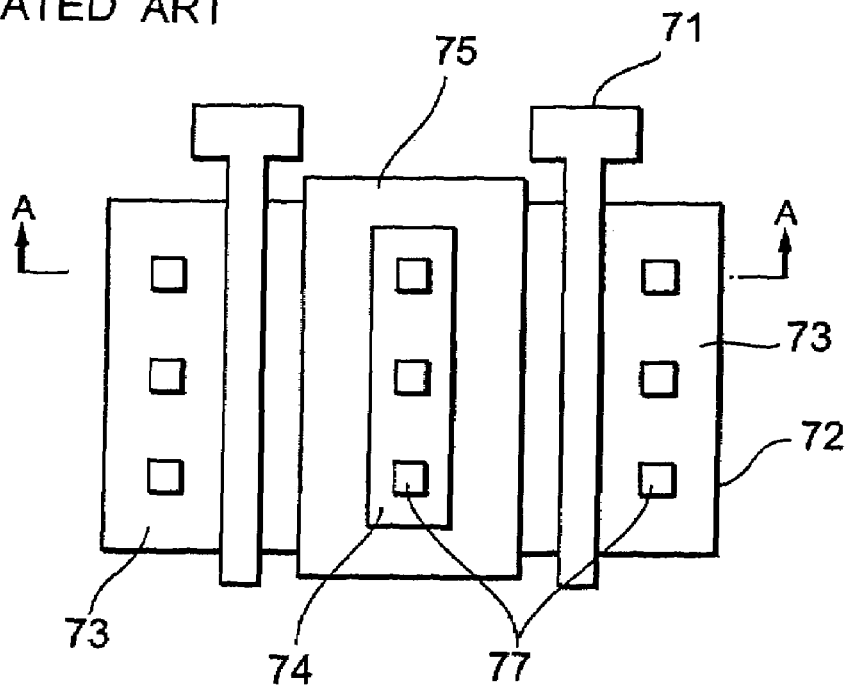
FIG. 7(a) is a schematic plan view of the pattern of a typical ESD protection NMOS transistor made using a salicide process.
Figure 7B:
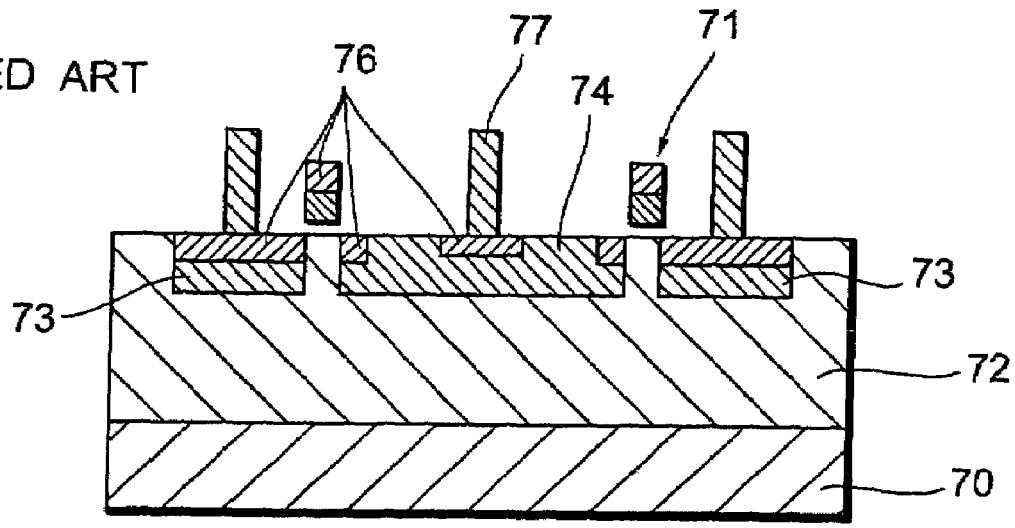
FIG. 7(b) is a schematic cross-sectional view on line A—A of the typical ESD protection NMOS transistor.
Figure 8A:
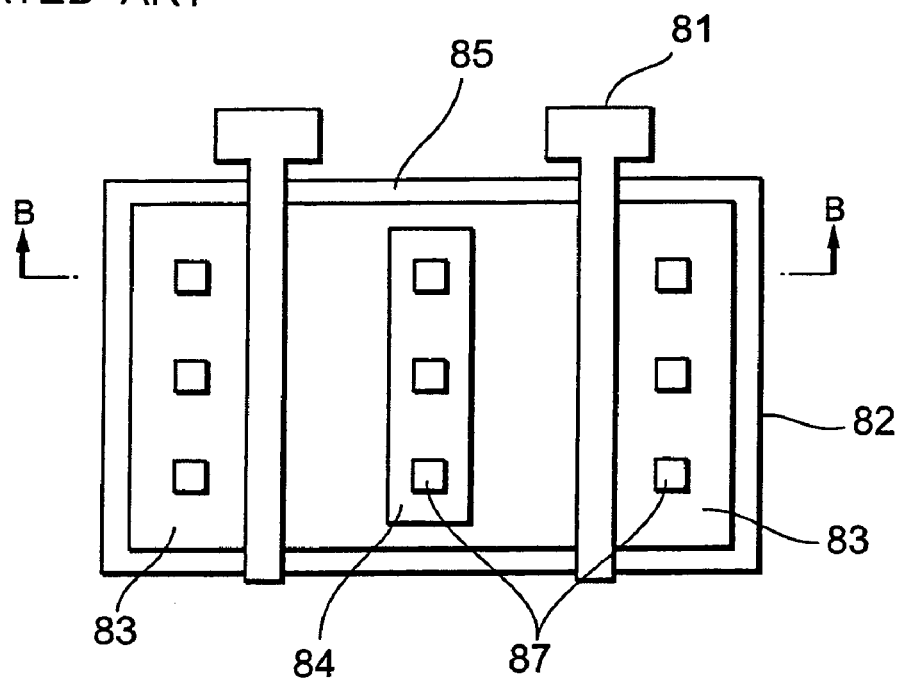
FIG. 8(a) is a schematic plan view of the pattern of an NMOS transistor having a device structure more excellent in ESD resistance and made using the salicide process.
Figure 8B:
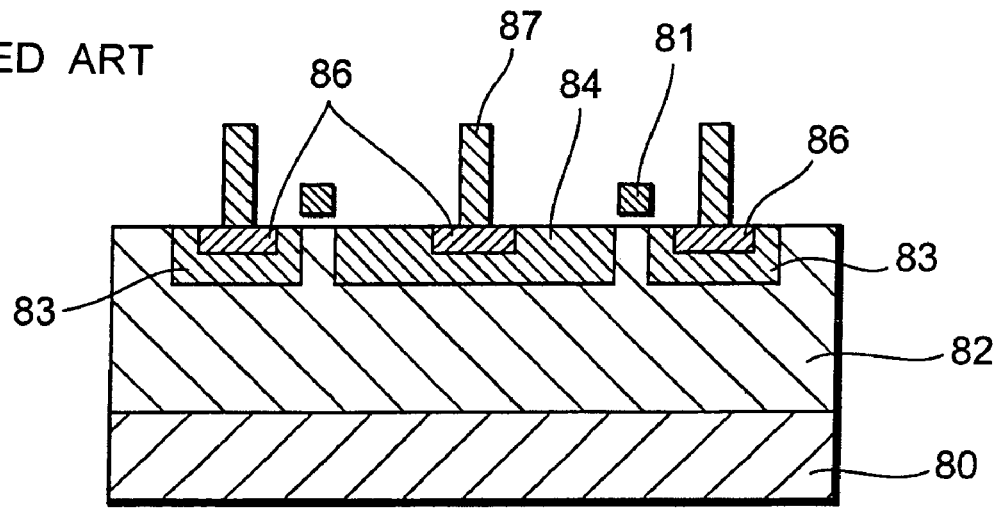
FIG. 8(b) is a schematic cross-sectional view on line A—A of the NMOS transistor of FIG. 8(a).

Here, in order to connect the gate electrode to the P− area, it is preferable that, for example as shown in FIG. 5, a P+ area 51 connected to the area of the P− diffusion layer 45 is newly formed and then the gate electrode is connected via a electrode wiring to the P+ area 51. With this configuration, the gate electrode 41 of the protection transistor can be connected to the P− diffusion layer 45 without increasing connection resistance.

Note that when an output circuit comprises NMOS and PMOS transistors, the P+ area 51 connected to the P− diffusion layer 45 under the gate electrode of the NMOS output transistor can be formed at the same time in the process of forming the P+ diffusion layers constituting the source and drain of the PMOS output transistor. That is, because a separate process is not necessary for forming the P+ area 51, the semiconductor apparatus of the present embodiment can be realized without increasing the total number of processes.

While in the present embodiment, a description has been made taking as an example the P+area 51 in the output circuit comprising NMOS and PMOS transistors, an N+ area to be connected to the gate electrode of a PMOS protection transistor in an output circuit comprising NMOS and PMOS transistors also can be formed in a like way as the P+ area 51 is formed.

Although the preferred embodiment of the semiconductor apparatus of the present invention has been described with reference to the accompanying drawings, the present invention is not limited to it. Obviously those skilled in the art will recognize that various modifications and changes may be made without departing from the scope of the invention, as defined by the appended claims, and it should be understood that such modifications and changes fall within the scope of the invention.

As described above, according to the present invention, by connecting the gate of the protection transistor with high ESD resistance to the Body region of the output transistor, when breakdown due to an ESD surge through the output electrode occurs earlier in the output transistor, the gate potential of the protection dummy transistor rises in conjunction with the rise of the Body potential. Thus, with the ON-current of the protection transistor flowing, the surge current does not concentrate in the output transistor, thereby protecting the output transistor.

Moreover, by connecting via an electrode wiring, the high speed device structure, which is low in ESD resistance, can be adopted for an output transistor without increasing layout area, and thus performance of the semiconductor apparatus can be improved.

What is claimed is:

1. A semiconductor apparatus which protects a first-conductivity-type MOS output transistor and a second-conductivity-type MOS output transistor against a surge entering through an output electrode connected to each of drains of said first-conductivity-type MOS output transistor whose source is connected to ground and said second-conductivity-type MOS output transistor whose source is connected to a power supply, said apparatus comprising:

a first-conductivity-type MOS protection transistor having a drain connected to the drain of said first-conductivity-type MOS output transistor, a source connected to a source of said first-conductivity-type MOS output transistor, and a gate connected to a second-conductivity-type layer under a gate of said first-conductivity-type MOS output transistor; and a second-conductivity-type MOS protection transistor having a drain connected to the drain of said second-conductivity-type MOS output transistor, a source connected to a source of said second-conductivity-type MOS output transistor, and a gate connected to a first-conductivity-type layer under a gate of said second-conductivity-type MOS output transistor;

wherein said first-conductivity-type MOS output transistor further includes a second-conductivity-type area which is formed in said second-conductivity-type layer and substantially surrounds said drain electrode and said source electrode, wherein said second-conductivity-type area has higher dopant concentration than said second-conductivity-type layer.

2. The semiconductor apparatus according to claim 1, wherein said first-conductivity-type MOS output transistor, said first-conductivity-type MOS protection transistor, said second-conductivity-type MOS output transistor, and said second-conductivity-type MOS protection transistor are of an SOI structure.

3. The semiconductor apparatus according to claim 2, wherein the second-conductivity-type area is connected to said second-conductivity-type layer under the gate of said first-conductivity-type MOS output transistor; and comprising a first-conductivity-type area connected to said first-conductivity-type layer under the gate of said second-conductivity-type MOS output transistor, wherein the gate of said first-conductivity-type MOS protection transistor is connected via said second-conductivity-type area to said second-conductivity-type layer under the gate of said first-conductivity-type MOS output transistor, and wherein the gate of said second-conductivity-type MOS protection transistor is connected via said first-conductivity-type area to said first-conductivity-type layer under the gate of said second-conductivity-type MOS output transistor.

4. The semiconductor apparatus according to claim 1, wherein the gates of said first-conductivity-type MOS protection transistor and said second-conductivity-type MOS protection transistor are connected by electrode wirings respectively to said second-conductivity-type layer under the gate of said first-conductivity-type MOS output transistor and to said first-conductivity-type layer under the gate of said second-conductivity-type MOS output transistor.

5. The semiconductor apparatus according to claim 1, wherein the drains of said first-conductivity-type MOS protection transistor and said second-conductivity-type MOS protection transistor are formed closer to the output electrode than the drains of said first-conductivity-type MOS output transistor and said second-conductivity-type MOS output transistor.

6. The semiconductor apparatus according to claim 1, wherein said first-conductivity-type MOS protection transistor and said second-conductivity-type MOS protection transistor are higher in electrostatic destruction withstand voltage than said first-conductivity-type MOS output transistor and said second-conductivity-type MOS output transistor.

7. The semiconductor apparatus according to claim 6, wherein said first-conductivity-type MOS output transistor, said first-conductivity-type MOS protection transistor, said second-conductivity-type MOS output transistor, and said second-conductivity-type MOS protection transistor are of an SOI structure.

8. The semiconductor apparatus according to claim 7, comprising
a second-conductivity-type area connected to said second-conductivity-type layer under the gate of said first-conductivity-type MOS output transistor; and
a first-conductivity-type area connected to said first-conductivity-type layer under the gate of said second-conductivity-type MOS output transistor,
wherein the gate of said first-conductivity-type MOS protection transistor is connected via said second-conductivity-type area to said second-conductivity-type layer under the gate of said first-conductivity-type MOS output transistor, and
wherein the gate of said second-conductivity-type MOS protection transistor is connected via said first-conductivity-type area to said first-conductivity-type layer under the gate of said second-conductivity-type MOS output transistor.

9. The semiconductor apparatus according to claim 6, wherein the gates of said first-conductivity-type MOS protection transistor and said second-conductivity-type MOS protection transistor are connected by electrode wirings respectively to said second-conductivity-type layer under the gate of said first-conductivity-type MOS output transistor and to said first-conductivity-type layer under the gate of said second-conductivity-type MOS output transistor.

10. The semiconductor apparatus according to claim 6, the drains of said first-conductivity-type MOS protection transistor and said second-conductivity-type MOS protection transistor are formed closer to the output electrode than the drains of said first-conductivity-type MOS output transistor and said second-conductivity-type MOS output transistor.

11. The semiconductor apparatus according to claim 10, wherein said first-conductivity-type MOS output transistor, said first-conductivity-type MOS protection transistor, said second-conductivity-type MOS output transistor, and said second-conductivity-type MOS protection transistor are of an SQI structure.

12. The semiconductor apparatus according to claim 11, comprising:
a second-conductivity-type area connected to said second-conductivity-type layer under the gate of said first-conductivity-type MOS output transistor; and
a first-conductivity-type area connected to said first-conductivity-type layer under the gate of said second-conductivity-type MOS output transistor,
wherein the gate of said first-conductivity-type MOS protection transistor is connected via said second-conductivity-type area to said second-conductivity-type layer under the gate of said first-conductivity-type MOS output transistor, and
wherein the gate of said second-conductivity-type MOS protection transistor is connected via said first-conductivity-type area to said first-conductivity-type layer under the gate of said second-conductivity-type MOS output transistor.

13. The semiconductor apparatus according to claim 10, wherein the gates of said first-conductivity-type MOS protection transistor and said second-conductivity-type MOS protection transistor are connected by electrode wirings respectively to said second-conductivity-type layer under the gate of said first-conductivity-type MOS output transistor and to said first-conductivity-type layer under the gate of said second-conductivity-type MOS output transistor.

14. The semiconductor apparatus according to claim 13, wherein said first-conductivity-type MOS output transistor, said first-conductivity-type MOS protection transistor, said second-conductivity-type MOS output transistor, and said second-conductivity-type MOS protection transistor are of an SOI structure.

15. The semiconductor apparatus according to claim 14, wherein the second-conductivity-type area is connected to said second-conductivity-type layer under the gate of said first-conductivity-type MOS output transistor; and
a first-conductivity-type area connected to said first-conductivity-type layer under the gate of said second-conductivity-type MOS output transistor,
wherein the gate of said first-conductivity-type MOS protection transistor is connected via said second-conductivity-type area to said second-conductivity-type layer under the gate of said first-conductivity-type MOS output transistor, and
wherein the gate of said second-conductivity-type MOS protection transistor is connected via said first-conductivity-type area to said first-conductivity-type layer under the gate of said second-conductivity-type MOS output transistor.

16. A semiconductor apparatus comprising:
an output electrode from which an output signal of the semiconductor apparatus is output;
a first-conductivity-type MOS output transistor respectively including a drain electrode connected to the output electrode, a source electrode connected to a ground voltage terminal, a gate electrode connected to a signal line, and a second-conductivity-type layer located under the gate electrode, wherein the first-conductivity-type MOS output transistor transmits the output signal of the semiconductor apparatus to the output electrode responsive to a signal on the signal line;
a first-conductivity-type MOS protection transistor respectively including a drain electrode connected to the output electrode, a source electrode connected to the ground voltage terminal, and a gate electrode connected to the ground voltage terminal; and
a metallic wiring member which connects the second-conductivity-type layer of the first-conductivity-type MOS output transistor to the gate electrode of the first-conductivity-type MOS protection transistor;
wherein said first-conductivity-type MOS output transistor further includes a second-conductivity-type area which is formed in said second-conductivity-type layer and substantially surrounds said drain electrode and said source electrode, wherein said second-conductivity-type area has higher dopant concentration than said second-conductivity-type layer.

17. The semiconductor apparatus according to claim 16, wherein said first-conductivity-type MOS output transistor and said first-conductivity-type MOS protection transistor are of an SOI structure.

18. The semiconductor apparatus according to claim 17, wherein the second-conductivity-type±area is connected to said second-conductivity-type layer under the gate electrode of said first-conductivity-type MOS output transistor, and
wherein the gate electrode of said first-conductivity-type MOS protection transistor is connected via said second-conductivity-type±area to said second-conductivity-type layer under the gate electrode of said first-conductivity-type MOS output transistor.

19. The semiconductor apparatus according to claim 16, wherein the drain electrode of said first-conductivity-type MOS protection transistor is formed closer to the output electrode than the drain electrode of said first-conductivity-type MOS output transistor.

20. The semiconductor apparatus according to claim 16, wherein said first-conductivity-type MOS protection transistor is higher in electrostatic destruction withstanding voltage than said first-conductivity-type MOS output transistor.

21. The semiconductor apparatus according to claim 20, wherein said first-conductivity-type MOS output transistor and said first-conductivity-type MOS protection transistor are of an SOI structure.

22. The semiconductor apparatus according to claim 21, wherein the second-conductivity-type area is connected to said second-conductivity-type layer under the gate electrode of said first-conductivity-type MOS output transistor,
wherein the gate electrode of said first-conductivity-type MOS protection transistor is connected via said second-conductivity-type area to said second-conductivity-type layer under the gate electrode of said first-conductivity-type MOS output transistor.

23. The semiconductor apparatus according to claim 20, wherein the gate electrode of said first-conductivity-type MOS protection transistor is connected by an electrode wiring to said second-conductivity-type layer under the gate electrode of said first-conductivity-type MOS output transistor.

24. The semiconductor apparatus according to claim 20, wherein the drain electrode of said first-conductivity-type MOS protection transistor is formed closer to the output electrode than the drain electrode of said first-conductivity-type MOS output transistor.

25. The semiconductor apparatus according to claim 24, wherein said first-conductivity-type MOS output transistor and said first-conductivity-type MOS protection transistor are of an SOI structure.

26. The semiconductor apparatus according to claim 25, wherein the second-conductivity-type area is connected to said second-conductivity-type layer under the gate electrode of said first-conductivity-type MOS output transistor,
wherein the gate electrode of said first-conductivity-type MOS protection transistor is connected via said second-conductivity-type area to said second-conductivity-type layer under the gate electrode of said first-conductivity-type MOS output transistor.

27. The semiconductor apparatus according to claim 24, wherein the gate electrode of said first-conductivity-type MOS protection transistor is connected by an electrode wiring to said second-conductivity-type layer under the gate electrode of said first-conductivity-type MOS output transistor.

28. The semiconductor apparatus according to claim 27, wherein said first-conductivity-type MOS output transistor and said first-conductivity-type MOS protection transistor are of an SQI structure.

29. The semiconductor apparatus according to claim 28, wherein the second-conductivity-type area is connected to said second-conductivity-type layer under the gate electrode of said first-conductivity-type MOS output transistor,
wherein the gate electrode of said first-conductivity-type MOS protection transistor is connected via said second-conductivity-type area to said second-conductivity-type layer under the gate electrode of said first-conductivity-type MOS output transistor.

30. The semiconductor apparatus according to claim 16, wherein the gate electrode of said first-conductivity-type MOS protection transistor is directly connected by the electrode wiring to said second-conductivity-type layer under the gate electrode of said first-conductivity-type MOS output transistor.

* * * * *